United States Patent
Chou et al.

(10) Patent No.: US 11,604,913 B2
(45) Date of Patent: Mar. 14, 2023

(54) OPTIMIZATION PROCESSING UNIT HAVING SUBUNITS THAT ARE PROGRAMMABLY AND PARTIALLY CONNECTED

(71) Applicant: Sync Computing Corp., Cambridge, MA (US)

(72) Inventors: Jeffrey Chou, Boston, MA (US); Suraj Bramhavar, Arlington, MA (US)

(73) Assignee: Sync Computing Corp., Cambridge, MA (US)

( * ) Notice: Subject to any disclaimer, the term of this patent is extended or adjusted under 35 U.S.C. 154(b) by 250 days.

(21) Appl. No.: 16/847,140

(22) Filed: Apr. 13, 2020

(65) Prior Publication Data

US 2021/0319161 A1    Oct. 14, 2021

(51) Int. Cl.
*G06F 30/331* (2020.01)
*G06F 9/38* (2018.01)
*G06F 9/455* (2018.01)

(52) U.S. Cl.
CPC .......... *G06F 30/331* (2020.01); *G06F 9/3877* (2013.01); *G06F 9/45525* (2013.01)

(58) Field of Classification Search
CPC .. G06F 30/331; G06F 9/3877; G06F 9/45525; G06F 30/30
See application file for complete search history.

(56) References Cited

U.S. PATENT DOCUMENTS

| | | | | |
|---|---|---|---|---|
| 5,303,191 A | * | 4/1994 | Eagan | G11C 7/1084 365/194 |
| 5,912,596 A | * | 6/1999 | Ghoshal | H03B 5/1296 331/74 |
| 6,278,731 B1 | * | 8/2001 | Galperin | H04L 25/03859 375/296 |
| 2009/0228238 A1 | * | 9/2009 | Mansinghka | G06N 7/04 702/181 |
| 2015/0070948 A1 | * | 3/2015 | Johnson | H02J 3/38 363/40 |
| 2016/0239947 A1 | * | 8/2016 | Cruz-Albrecht | G06N 3/049 |
| 2016/0248787 A1 | * | 8/2016 | Kadambe | H04L 63/1416 |
| 2019/0205741 A1 | * | 7/2019 | Gupta | G06F 9/3877 |

OTHER PUBLICATIONS

Ajagekar et al., Quantum Computing Based Hybrid Solution Strategies for Large-Scale Discrete-Continuous Optimization Problems, Computers and Chemical Engineering 132 (2020) 106630, available online Oct. 31, 2019, pp. 1-19.
Chou et al., Analog Coupled Oscillator Based Weighted Ising Machine, Scientific Reports, NatureResearch, Oct. 15, 2019, pp. 1-10.

* cited by examiner

*Primary Examiner* — Jorge A Chu Joy-Davila
(74) *Attorney, Agent, or Firm* — Van Pelt, Yi & James LLP

(57) ABSTRACT

Techniques usable in optimization processing are described. A system includes an optimization processing unit (OPU). The OPU includes stochastic computing units and at least one programmable interconnect. Each of the stochastic computing units includes nodes and multiplication unit(s) configured to interconnect at least a portion of the nodes. The programmable interconnect(s) are configured to provide weights for and to selectably couple a portion of the stochastic computing units.

16 Claims, 7 Drawing Sheets

OPTIMIZATION PROCESSING UNIT HAVING SUBUNITS THAT ARE PROGRAMMABLY AND PARTIALLY CONNECTED

BACKGROUND OF THE INVENTION

Certain problems are difficult to solve utilizing standard computing architectures. For example, combinatorial optimization (CO) problems such as the traveling salesman problem may be more effectively solved using other means. Such CO problems have a wide range of applications, from traffic routing to DNA sequencing and drug discovery. Various technologies, including quantum computers, may be used in solving such problems. However, there are drawbacks to techniques such as quantum computing. For example, quantum computers are difficult to manufacture and expensive to maintain. Standard computing methods may also be utilized, however they are fundamentally limited by the memory bandwidth bottleneck. Consequently, an improved mechanism for tackling problems that is usable in CO and other fields is desired.

BRIEF DESCRIPTION OF THE DRAWINGS

Various embodiments of the invention are disclosed in the following detailed description and the accompanying drawings.

DETAILED DESCRIPTION

Figure 1A:
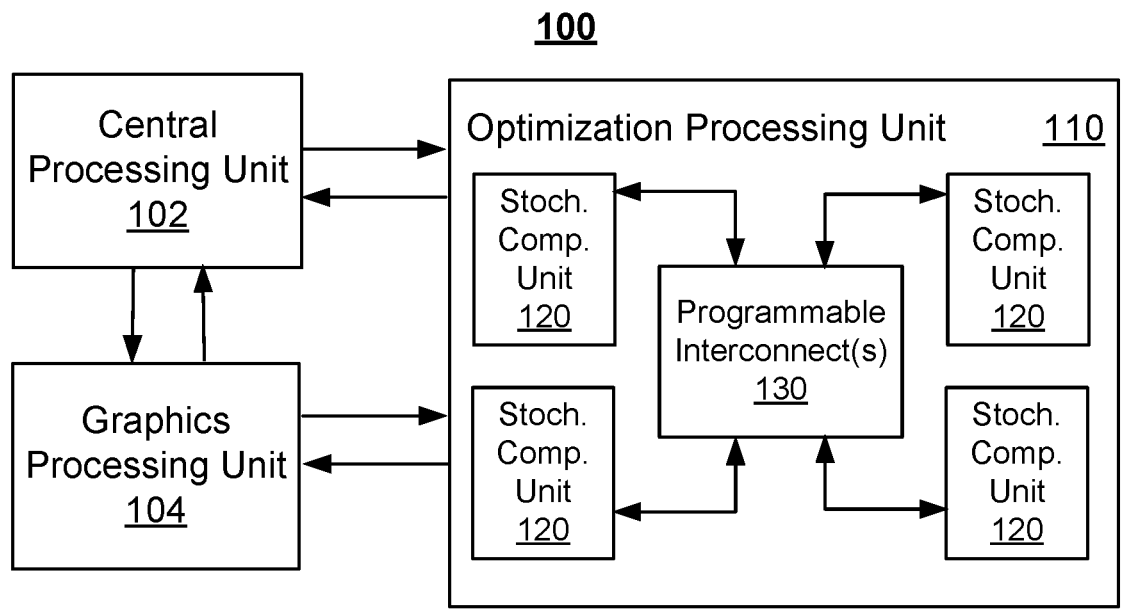
FIGS. 1A-1B are block diagrams depicting an embodiment of a system including an optimization processing unit.

The invention can be implemented in numerous ways, including as a process; an apparatus; a system; a composition of matter; a computer program product embodied on a computer readable storage medium such as a non-transitory computer readable medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Techniques usable in optimization processing are described. For example a system including an optimization processing unit (OPU) is discussed. The system may also include processor(s) such as central processing unit(s) (CPU(s)) and/or graphical processing unit(s) (GPU(s)). The OPU includes stochastic computing units and at least one programmable interconnect. Each of the stochastic computing units includes a plurality of nodes and at least one multiplication unit configured to interconnect at least a portion of the nodes. The programmable interconnect(s) are configured to provide weights for and to selectably couple a portion of the plurality of stochastic computing units. The programmable interconnect(s) may include field programmable gate array(s) (FPGAs).

Some or all of the stochastic computing unit may include integrated circuit components. For example, the nodes of the stochastic computing units may be formed on silicon wafers and/or operate at temperatures at or above zero degrees Celsius (e.g. at room temperature or above). The nodes correspond to oscillators. In some embodiments, the nodes include one or more oscillators. For example, the nodes may be analog oscillators such as inductive-capacitive (LC) oscillators. The nodes may also be representations of oscillators, simulating oscillator values such as the amplitude and/or phase. In some embodiments, the representations of oscillators are digital representations of oscillators. The nodes may represent oscillators by solving differential equations which govern the dynamics of an oscillator system. For example, the nodes may use one of a variety of methods (e.g. Euler method) to solve the governing differential equations of a dynamical system, such as an oscillator. Digital representations of oscillators solve these differential equations utilizing digital techniques. As used herein, therefore, an oscillator includes, but may not be limited to, an analog oscillator and a digital or other representation of an oscillator. In some embodiments, the multiplication unit of a stochastic computing unit includes a crossbar array. In some embodiments, the multiplication unit is programmable and/or includes an FPGA. In some embodiments, the nodes of the stochastic computing unit are fully connected (each node is connected to all other nodes) by the multiplication unit. In some embodiments, the nodes are sparsely connected (each node is connected to only some of the other nodes at a particular time) by the multiplication unit. In some embodiments, the node connections are reconfigurable, for example by a user. For FPGAs used in connection with analog oscillators, analog-to-digital (AD) and digital-to-analog (DA) converters may be coupled between the analog oscillators and the FPGA.

In some embodiments, data for at least a portion of an optimization problem is received at the OPU. In some embodiments, the information provided by the user may be in the form of a quadratic unconstrained binary optimization (QUBO) problem (described below). In some embodiments, the information provided by the user may be in the form of a quadratic programing form (QP) problem (described below). In some embodiments, the information provided by the user may be in the form of an Ising Model (discussed below). In some embodiments, the information provided by the user may be in the form of a linear program (LP) problem (discussed below). In some embodiments, the information provided may be in another form. Responses for the optimization problem are calculated in the stochastic computing units. For example, data may be input to and output sampled from nodes within each stochastic computing unit. These outputs are weighted and reapplied to the nodes within the stochastic computing unit via the multiplication unit. This process may be repeated one or more times to obtain the responses from the stochastic computing units. Thus, responses may be determined in parallel by multiple stochastic computing units. Weights are applied to the responses from the stochastic computing units to provide a plurality of weighted responses. This may be accomplished via the programmable interconnect. The weighted responses are provided as input(s) to a portion of the stochastic computing units. The portion of the stochastic computing units may be selected via the programmable interconnect. This process of receiving responses from stochastic computing units, weighting the responses and providing the weighted responses as input(s) to some portion of the stochastic computing units may be repeated one or more times. The OPU may then provide optimized responses to the portion of the problem received.

Figure 1B:
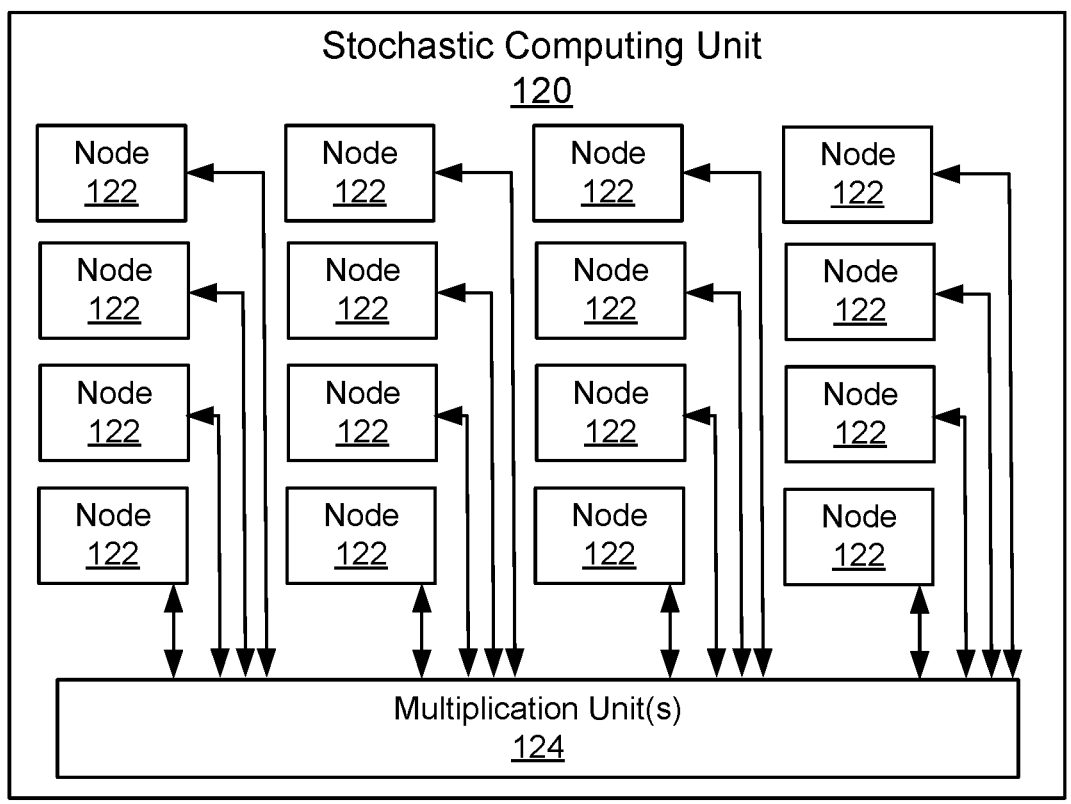

FIGS. 1A and 1B are block diagrams depicting an embodiment of system 100 usable in optimization processing. FIG. 1A depicts system 100 including OPU 110. FIG. 1B depicts an embodiment of stochastic computing unit 120 usable in OPU 110. System 100 is usable in combinatorial optimization (CO) and/or in other fields. For clarity, only certain components of system 100 are depicted.

System 100 includes CPU 102 and GPU 104 in addition to OPU 110. Although system 100 is described in the context of a single OPU 110, a single CPU 102 and a single GPU 104, in some embodiments, system 100 may include multiple OPUs, multiple CPUs and/or multiple GPUs. In some embodiments, CPU 102 and/or GPU 104 may be omitted. Further, in the case of multiple OPUs, all OPUs can, but need not, be configured in a manner analogous to OPU 110.

CPU 102 may be used to carry out various functions associated with optimization processing. CPU 102 may read and decode instructions and offload the work to OPU 110, GPU 104 or FPGAs (not shown), depending on the instruction. In some embodiments, CPU 102 can itself perform the optimization in general. More specifically, CPU 102 can be used for solving CO problems defined in a classical manner e.g. as a linear programming solution. The CO problem itself can be partitioned into a classical part and a stochastic processing unit part. In one embodiment, the classical part can be solved using a CPU (e.g. CPU 102) and the stochastic processing part can be solved using an OPU, GPU and/or FPGA (e.g. OPU 110, GPU 104 and FPGAs not shown in FIGS. 1A-1B). The systems and techniques described herein are programmable, e.g. by the user. The part of the problem that is to be partitioned between various units (e.g. CPU 102, GPU 104 and/or OPU 110) can be user defined through a programmable interface (not shown in FIG. 1). The user can choose to partition the workload related to solving the CO problem between the CPU(s), GPU(s), FPGA(s), OPU(s) (e.g. CPU 102, GPU 104 and/or OPU 110). Partitioning the problem into classical versus stochastic computing parts is also programmable.

OPU 110 includes stochastic computing units 120 and one or more programmable interconnects 130. For simplicity, OPU 110 is described in the context of a single programmable interconnect 130. However, in some embodiments, multiple programmable interconnects are present. Although four stochastic computing units 120 are shown, in other embodiments, another number of stochastic computing units 120 may be used. In FIG. 1A, stochastic computing units 120 are shown as the same. However, in other embodiments, stochastic computing units 120 may differ. For example, stochastic computing units 120 may include different numbers and/or types of nodes, different numbers and/or types of multiplication units and/or may differ in another manner.

A stochastic computing unit, such as a stochastic computing unit 120, is configured to provide, based on data input to the stochastic computing unit 120, responses that are probabilistic in nature. For example, the responses may be based upon the phases of one or more oscillators in stochastic computing unit 120 at the particular time the oscillator(s) are sampled. The phases of the oscillators, which may be considered to be 0° or 180° for the purposes of operation in stochastic computing unit 120, may differ based upon initial conditions for the oscillator and/or the time at which the oscillator is sampled. The phases of these oscillators may be used to model equations, such as the Hamiltonian (e.g. the Ising Hamiltonian) used for some CO problems and/or the corresponding differential equation for the phases of oscillators used in providing a solution to the Hamiltonian. In other embodiments, the responses may be based on the amplitude of the oscillators. The responses of the oscillators may be binary, multi-bit, or continuous. For example, the oscillator output phase could range in value (via analog or digital representation) between 0° or 180°. Other and/or additional mechanisms for obtaining the probabilistic responses form the nodes may be utilized in other embodiments.

Programmable interconnect 130 is configured to provide weights for and to selectably couple a portion of stochastic computing units 120. For example, results sampled from a particular stochastic computing unit 120 are weighted and provided to a subset of the remaining stochastic computing units 120 via programmable interconnect 130. Stochastic computing unit(s) 120 that are part of this subset are reconfigurable and, therefore, not fixed in hardware. For example, programmable interconnect 130 may include one or more FPGAs. In some embodiments, programmable interconnect 130 may provide weights for and selectably couple up to all of stochastic computing units 120. Thus, programmable interconnect 130 may be viewed as weighting and mixing signals from stochastic computing units 120 and providing weighted, mixed signals as inputs to one or more other stochastic computing units 120.

FIG. 1B depicts an embodiment of stochastic computing unit 120. Stochastic computing unit 120 includes nodes 122 and multiplication unit(s) 124. Although a particular number (e.g. sixteen) of nodes 122 are shown, another number may be utilized. Similarly, although a single multiplication unit 124 is depicted, another number may be used. In some embodiments, each node 122 provides output that is probabilistic in nature. For example, each node 122 may include an oscillator and/or analogous mechanism that has an output that changes with time and/or depends upon initial conditions, as described above. In some embodiments, nodes 122 include or consist of circuit components that are utilized at temperatures at or above zero degrees Celsius (e.g. room temperature or above). In some embodiments, nodes 122 may include or consist of circuit components formed on silicon wafers as part of an integrated circuit. In other embodiments, nodes 122 may be formed in another manner. For example, nodes 122 may be analog or digital in nature. In some embodiments, nodes 122 may include or consist of analog circuits such as an LC oscillator. In some embodiments, nodes 122 may be a digital representation of an oscillator and/or analogous mechanism. In some embodiments, nodes 122 may represent digital oscillators by solving differential equations which govern the dynamics of an oscillator system. For example, the nodes may use one of a variety of methods (e.g. Euler method) to solve the governing differential equations of a dynamical system, such as an oscillator.

Multiplication unit 124 interconnects nodes 122. In some embodiments, multiplication unit 124 fully connects nodes 122. In such a case, each node 122 is coupled with all other nodes 122 in stochastic computing unit 120. In some embodiments, multiplication unit sparsely connects nodes 122. In this case, each node 122 is connected with a subset of the remaining nodes in stochastic computing unit 120. Multiplication unit 124 also applies weights to the output of each node. The weighted output of each node 122 is provided as an input to some or all of the remaining nodes 122 via multiplication unit 124. In some embodiments, multiplication unit 124 is a crossbar array. In such a case, the connectivity between nodes 122 may be set in hardware. For example, a crossbar array may be configured to fully connect nodes 122. In such embodiments, nodes 122 are always fully connected. The weights may, however, be reconfigurable. In other embodiments, the crossbar array may be configured with a particular node 122 connected to only some of the remaining nodes 122. The particular node 122 is always connected to the same nodes. However, the weights may be changeable. In other embodiments, the connectivity between nodes 122 may be programmable. In such embodiments, nodes 122 may be fully connected sometimes, sparsely connected sometimes, and/or the nodes to which a particular node 122 is connected may be varied. Thus, the connections between nodes 122 may be reconfigured using multiplication unit 124. In some such embodiments, multiplication unit 124 may include one or more FPGAs.

System 100 including OPU 110 may be utilized in solving CO problems as well as problems in other fields. System 100 may have improved performance. OPU 110 may utilize stochastic computing units 120 in parallel. Thus, OPU 110 may more rapidly and efficiently provide responses to input data. Individual stochastic computing units 120 having fewer nodes 122 may be easier to build. OPU 110 may be more readily manufactured than a single OPU having the same total number of nodes as stochastic computing units 120 but which has its nodes fabricated as a single block. OPU 110 may also be more easily scaled to a larger number of nodes. In some embodiments, nodes 122 may be built on silicon and/or run at temperatures well above liquid helium (e.g. above four Kelvin). In some embodiments, nodes 122 are used at temperatures of at least zero degrees Celsius. For example, node 122 may operate at or above room temperature (approximately twenty-three degrees Celsius). Consequently, OPU 110 may be more readily fabricated and utilized than, for example, quantum processors. In addition, the communication between OPU 110 and remaining components of system 100, such as CPU 102 and/or GPU 104 may be facilitated and subject to reduced latency than other mechanisms such as quantum computing.

Figure 2:
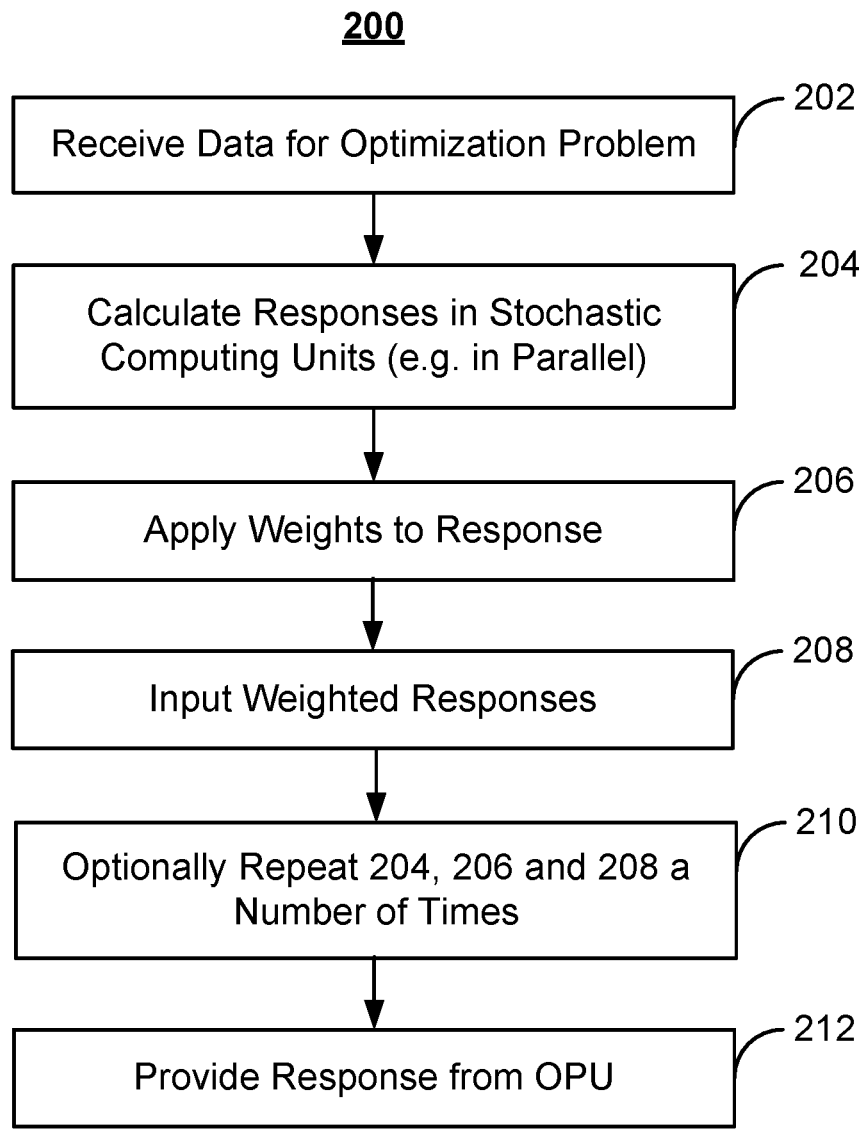
FIG. 2 is a flow chart depicting an embodiment of a method for utilizing an optimization processing unit.

FIG. 2 is a flow chart depicting an embodiment of method 200 for performing optimization processing utilizing an OPU such as OPU 110. For example, method 200 may be used in CO and/or other disciplines. Method 200 commences after the user has defined the problem for which the OPU is utilized. For example, if a traveling salesman problem is desired to be solved, the cities visited, the distance between cities, cost of case, miles per gallon, cost of hotels, problem constraints, and other information is provided by the user. In some embodiments, the information provided by the user may be in the form of a quadratic unconstrained binary optimization (QUBO) problem: $x^TQx+c^Tx$, where x is a binary vector such that $x_i \in \{0,1\}$, Q is a 2D matrix of real numbers, and c is a vector of real numbers. The problem is encoded in the elements of Q and c. In some embodiments, the information provided by the user may be in the form of a quadratic programing form (QP) problem: $x^TQx+c^Tx$, where x is a continuous vector such that $x_i \in \mathbb{R}$, Q is a 2D matrix of real numbers, and c is a vector of real numbers. The problem is encoded in the elements of Q and c. In some embodiments, the information provided by the user may be in the form of an Ising Model: $s^TJs+h^Ts$, where s is a vector such that the elements are either +1 or −1 $s_i \in \{-1,+1\}$, J is a 2D matrix of real numbers, h is a vector of real numbers. The problem is encoded in the elements of J and h. In some embodiments, the information provided by the user may be in the form of a linear program (LP) problem: Ax−b, where x is a vector of real numbers $x_i \in \mathbb{R}$ is a matrix of real numbers, and b is a vector of real numbers. The problem is encoded in the elements of A and b. In some embodiments, the information provided may be in another form. In some embodiments, the CPU or GPU may break the problem up into smaller chunks for presentation to the OPU. In some embodiments, the CPU or GPU may use the OPU to address the problem in its entirety. The CPU and/or GPU may also be used to map the problem to the behavior of a system of nodes used in the OPU.

The OPU receives data for at least a portion of the optimization problem, at 202. In some embodiments, the OPU receives the input from the CPU or GPU. In addition to the inputs for the stochastic computing units, the OPU may also receive weights for the programmable interconnect(s), an indication of the number of iterations performed by stochastic computing units 120, timing of changes to weights and/or other information used to address the optimization problem. Thus, the processing by the OPU may be managed by the CPU.

Using the data, the OPU calculates responses in the stochastic computing units, at 204. In some embodiments, the stochastic computing units may operate in parallel to provide their responses at 204. Thus, the appropriate data is provided to the stochastic computing units. In some embodiments, the same data is provided to each of the stochastic computing units. Thus, each stochastic computing unit may provide responses to the same portion of the problem. In some embodiments, different data are provided to different stochastic computing units. For example, different stochastic computing units may provide responses to different portions of the problem. The stochastic computing units utilize the nodes therein to determine responses to the data. In some embodiments, each stochastic computing unit provides inputs to its nodes. The outputs from the nodes are sampled and provided to the multiplication unit(s) in the stochastic computing unit. In such embodiments, the multiplication unit(s) apply weights to the outputs to provide weighted outputs. These weighted outputs are provided to some or all of the nodes as inputs. The number of iterations performed by the stochastic computing units may also be controlled by information provided by the CPU or GPU.

Weights are applied to the responses from the stochastic computing units to provide weighted responses, at 206. In some embodiments, 206 may precede 204. In other embodiments, 204 precedes 206. In some embodiments, the weights are applied by the programmable interconnect(s) and may be controlled by the CPU and/or GPU. In some embodiments, the weights are applied by an FPGA system. In some embodiments, the weight(s) applied to responses from a particular stochastic computing unit do not depend upon the stochastic computing units which receive the weighted response. In other embodiments, the weight(s) applied to responses from a particular stochastic computing unit do depend upon the stochastic computing units which receive the weighted response. In some embodiments, the weights may only apply to a portion of the nodes. The portion of the nodes may be selected programmably by the user, which serve as a reconfigurable interconnect system. In some embodiments, the weights applied to the responses may be scaled by a time step, as is typically done in differential equation solver methods, such as the Euler method. The time step may be programmed by a user.

The weighted responses for each stochastic computing unit are provided as inputs to a portion of the other stochastic computing units, at 208. In some embodiments, 208 is performed by the programmable interconnect(s). Further, the selection of the stochastic computing units to which the weighted response for a given stochastic computing unit are applied may be controlled by the CPU and/or GPU. In some embodiments, 204, 206 and 208 may be repeated as desired to update the responses from the stochastic computing units, at 210. One or more responses are selected to be provided from the OPU, at 212. These responses to the may be provided to the CPU and/or GPU for use in solving the desired problem. In some embodiments, method 200 may be iterated multiple times. For example, the response provided from OPU at 212 may be utilized by the CPU or GPU to adjust weights for the optimization problem and method 200 repeated for the same portion(s) of the optimization problem. In some embodiments, the response provided at 212 may simply be utilized to provide a solution to the optimization problem. Method 200 may also be performed for other portion(s) of the optimization problem.

For example, if system 100 utilizes method 200, OPU 110 receives data for at least a part of the problem being addressed, at 202. The data is received at OPU 110 from CPU 102 and/or GPU 104. OPU 110 utilizes the data to calculate responses in stochastic computing units 120, at 204. Thus, responses are determined in parallel by stochastic computing units 120. To do so and as part of 204, stochastic computing units 120 each provides inputs to its nodes 122. Nodes 122 are sampled to provide outputs. The outputs from nodes 122 are provided to multiplication unit 124. Multiplication unit 124 applies weights to the outputs. These weighted outputs are (re)input to some or all of nodes 122. This process of sampling each node 122, weighting the outputs, and providing the weighted outputs as inputs to other node(s) 122 may be iteratively performed multiple times in each of stochastic computing units 120. Thus, stochastic computing units 120 may operate in parallel to provide their responses at 204.

Programmable interconnect 130 applies weights to the responses from stochastic computing units 120, at 206. Thus, weighted responses are obtained. Programmable interconnect 130 also provides the weighted responses from a particular stochastic computing unit 120 to some portion of the remaining stochastic computing units 120, at 208. Because programmable interconnect 130 is reconfigurable, not only can the weight(s) applied be changed, but the stochastic computing units 120 to which the weighted responses are applied can be altered. Programmable interconnects create a much more versatile platform and help address a wider array of problems, as different applications tend to have different connectivity requirements. This is in stark contrast to both quantum systems which have limited connectivity and alternative digital annealers which aim for full all-all connectivity and as a result have limited size.

OPU 110 may iteratively repeat some or all of 204, 206 and 208, at 210. One or more responses are selected to be provided from OPU 120 to CPU 102 and/or GPU 104, at 212. System 100 my repeat some or all of method 200. In some embodiments, the response provided at 212 for the first iteration may simply be utilized to provide a solution to the optimization problem. Method 200 may also be performed for other portion(s) of the optimization problem.

Thus, using method 200, system 100 and OPU 110 may be used in solving challenging problems, for example in CO and other fields. Because stochastic computing units 120 operate in parallel, OPU 110 may more rapidly and efficiently provide responses using method 200. In addition, the communication between OPU 110 and remaining components of system 100, such as CPU 102 and/or GPU 104 may be facilitated and subject to reduced latency in implementing method 200.

Figure 3:
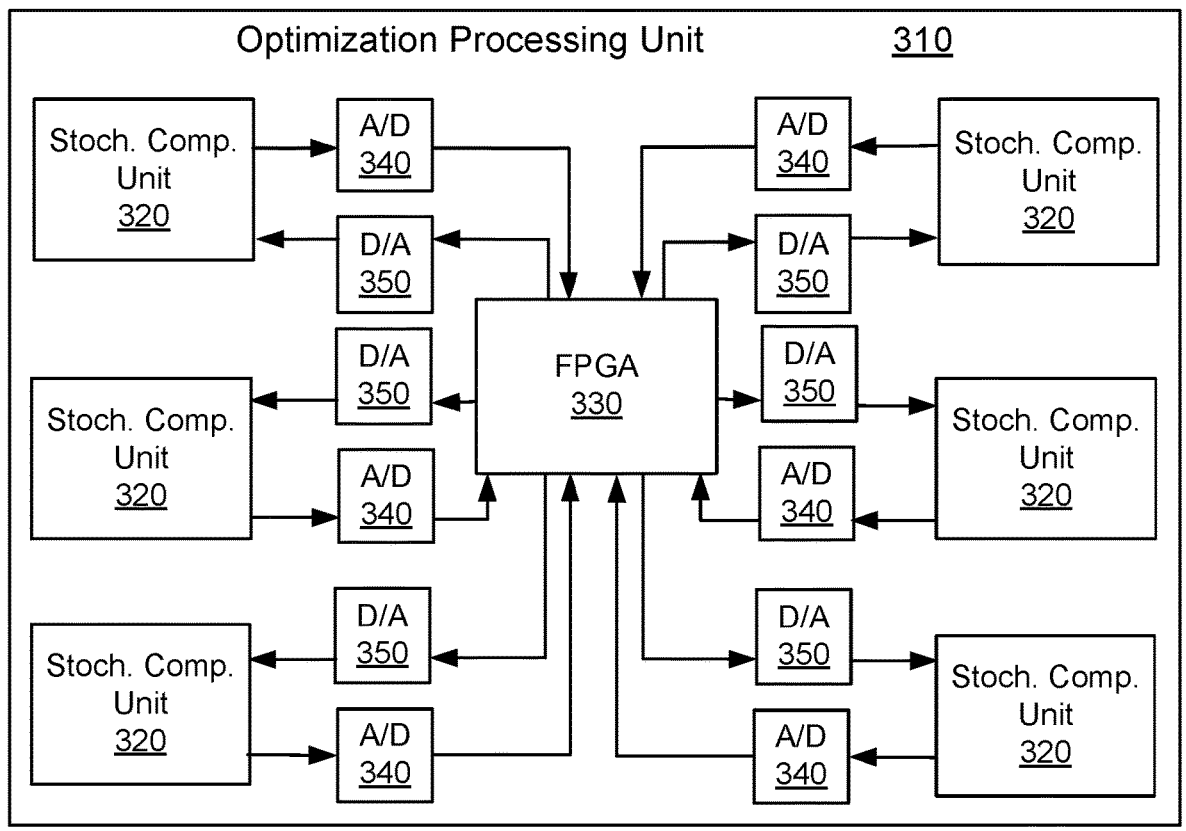
FIG. 3 depicts an embodiment of an optimization processing unit.

FIG. 3 is a block diagram depicting an embodiment of system 300 usable in optimization processing. For simplicity, only OPU 310 is shown. However, other components, such as CPU(s) and/or GPU(s) analogous to CPU 102 and GPU 104 may be included. System 300 is usable in combinatorial optimization (CO) and/or in other fields.

OPU 310 is analogous to OPU 110. Thus, OPU 310 includes stochastic computing units 320 and FPGA 330 that are analogous to stochastic computing units 120 and programmable interconnect 130. Although six stochastic computing units 320 are shown, in other embodiments, another number of stochastic computing units 320 may be used. Similarly, although one FPGA 330 is shown, multiple FPGAs may be used. In FIG. 3, stochastic computing units 320 are shown as the same. However, in other embodiments, stochastic computing units 320 may differ. For example, stochastic computing units 320 may include different numbers and/or types of nodes, different numbers and/or types of multiplication units and/or may differ in another manner.

Stochastic computing units 320 are configured to provide, based on data input to the stochastic computing unit 320, responses that are probabilistic in nature. Thus, stochastic computing units 320 may each include nodes (not explicitly shown in FIG. 3) that provide outputs that are probabilistic in nature and are analogous to nodes 122. For example, each node may include an oscillator and/or analogous mechanism that has an output that changes with time and/or depends upon initial conditions, as described above. In some embodiments, nodes in stochastic computing units 320 include or consist of circuit components that are utilized at temperatures at or above zero degrees Celsius (e.g. room temperature or above). In some embodiments, the nodes may include or consist of circuit components formed on silicon wafers as part of an integrated circuit.

FPGA 330 is configured to provide weights for and to selectably couple a portion of stochastic computing units 320. FPGA(s) 330 can thus reconfigure not only the weights applied to responses from stochastic computing units 320 but also the connectivity between stochastic computing units 320. In some embodiments, FPGA 330 may provide weights for and selectably couple up to all of stochastic computing units 320.

As discussed above, stochastic computing units 320 utilize analog circuitry in some embodiments. For example, stochastic computing units 320 may include analog oscillators. Thus, in such embodiments, signals from stochastic computing units 320 to FPGA 330 are converted from analog to digital using analog-to-digital (A/D) converters 340. Similarly, signals from FPGA 330 to stochastic computing units 320 are converted from digital to analog using digital-to-analog (D/A) converters 350. In embodiments, in which stochastic computing units 320 are digital in nature, A/D converters 340 and D/A converters 350 may be omitted. In some embodiments, A/D converters 340 and/or D/A converters 350 may be incorporated into stochastic computing units 320.

OPU 310 may be utilized in solving CO problems as well as problems in other fields. OPU 310 may utilize stochastic computing units 320 in parallel. Thus, OPU 310 may more rapidly and efficiently provide responses to input data. Individual stochastic computing units 320 having fewer nodes may be easier to build. OPU 310 may be more readily manufactured and may be more easily scaled to a larger number of nodes. In some embodiments, nodes in stochastic computing units 320 may be built on silicon and/or run at temperatures well above liquid helium (e.g. above four Kelvin). Consequently, OPU 310 may be more readily fabricated and utilized than, for example, quantum processors. In addition, the communication between OPU 310 and remaining components of system 300 may be facilitated and subject to reduced latency than other mechanisms such as quantum computing. Further, use of FPGA 330 may allow for higher precision multiplication of responses by weights. Thus, performance of system 300 may be improved.

Figure 4:
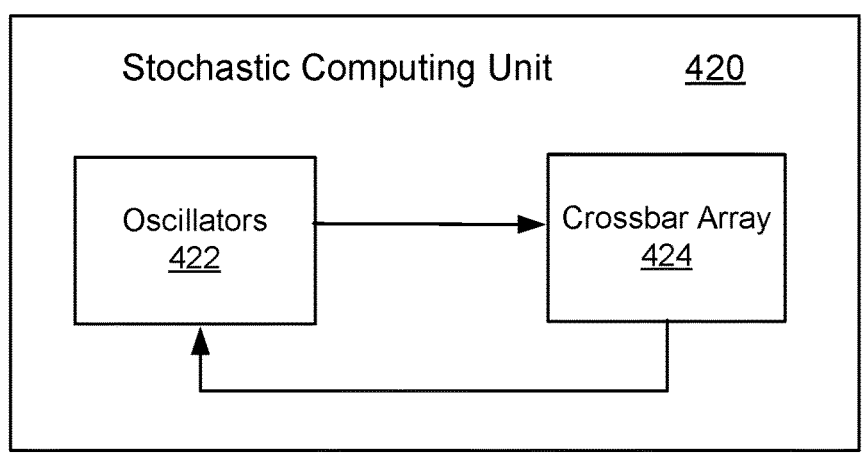
FIG. 4 depicts an embodiment of a stochastic computing unit.

FIG. 4 is a block diagram depicting an embodiment of stochastic computing unit 420 usable in an OPU, such as OPU 110 and/or 210. Stochastic computing unit 420 is analogous to stochastic computing units 120 and 320. Thus, stochastic computing unit 420 is configured to provide, based on data input to the stochastic computing unit 420, responses that are probabilistic in nature. Stochastic computing unit 420 includes oscillators 422 and crossbar array 424. Oscillators 422 are analogous to nodes 122. Crossbar array 424 is analogous to multiplication unit 124.

Oscillators 422 have outputs that change with time and depend upon initial conditions, as described above for nodes 122. Any number of oscillators 422 might present in stochastic computing unit 420. In some embodiments, each of the oscillators 422 include or consist of circuit components that are utilized at temperatures at or above zero degrees Celsius (e.g. room temperature or above). In some embodiments, each oscillator 422 may include or consist of circuit components formed on silicon wafers as part of an integrated circuit. In some embodiments, oscillators 422 are analog oscillators. In other embodiments, oscillators 422 may include or consist of components that are digital. The oscillators may also be digital representations of oscillators, simulating oscillator values such as the amplitude or phase. The digital oscillators may be implemented by solving differential equations which govern the dynamics of an oscillator system. For example, the nodes may use one of a variety of methods (e.g. Euler method) to solve the governing differential equations of a dynamical system, such as an oscillator.

Crossbar array 424 interconnects oscillators 422 and applies weights to the output of each oscillator 422. The weights may be altered. In some embodiments, crossbar array 424 fully connects oscillators 422. In such a case, each oscillator 422 is coupled with all other oscillators 422 in stochastic computing unit 420. For example, an output line from a particular oscillator 422 is connected via crossbar array 424 (e.g. through a reconfigurable resistance) to the input lines of every other oscillator 422. In some embodiments, crossbar array 424 sparsely connects oscillators 422. For example, an output line from a particular oscillator 422 is connected via crossbar array 424 (e.g. through a reconfigurable resistance) to only a subset of the input lines to other oscillators 422. In this case, each oscillator 422 is connected with a subset of the remaining oscillators 422 in stochastic computing unit 420. Thus, the weighted output of each oscillator 422 is provided as an input to some or all of the remaining oscillators 422 via crossbar array 424.

Stochastic computing unit 420 may be utilized in solving CO problems as well as problems in other fields. Thus, an OPU employing stochastic computing unit 420 may enjoy benefits described herein.

Figure 5:
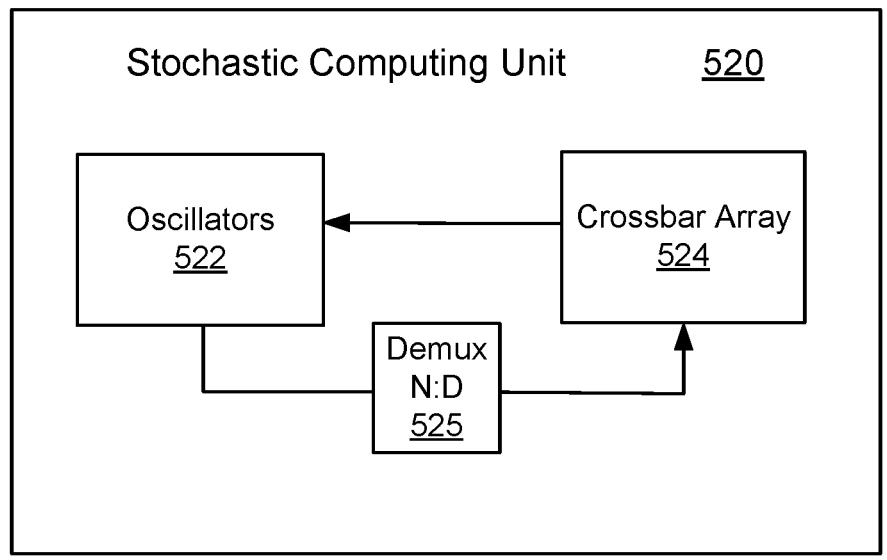
FIG. 5 depicts another embodiment of a stochastic computing unit.

FIG. 5 is a block diagram depicting an embodiment of stochastic computing unit 520 usable in an OPU, such as OPU 110 and/or 210. Stochastic computing unit 520 is analogous to stochastic computing units 120, 320 and 420. Thus, stochastic computing unit 520 is configured to provide, based on data input to the stochastic computing unit 520, responses that are probabilistic in nature. Stochastic computing unit 520 includes oscillators 522 and crossbar array 524. Oscillators 522 are analogous to nodes 122 and oscillators 422. Crossbar array 524 is analogous to multiplication unit 124 and crossbar array 424. In addition, stochastic computing unit 520 includes demultiplexer 525. Demultiplexer 525 may be used to select a portion of oscillators 522 in stochastic computing unit 520 to send to crossbar array 524. In some embodiments, a user can programmatically control demultiplexer 525 to select which nodes will be sent to the crossbar array and which nodes will be received from the crossbar array. This control allows a reconfigurable interconnect system for both analog and digital systems.

Oscillators 522 have outputs that change with time and depend upon initial conditions, as described above for nodes 122 and oscillators 422. Any number of oscillators 522 might present in stochastic computing unit 520. In some embodiments, each of the oscillators 522 include or consist of circuit components that are utilized at temperatures at or above zero degrees Celsius (e.g. room temperature or above). In some embodiments, each oscillator 522 may include or consist of circuit components formed on silicon wafers as part of an integrated circuit. In some embodiments, oscillators 522 are analog oscillators. In other embodiments, oscillators 522 may include or consist of components that are digital. The oscillators may also be digital representations of oscillators, simulating oscillator values such as the amplitude or phase. The digital oscillators may be implemented by solving differential equations which govern the dynamics of an oscillator system. For example, the nodes may use one of a variety of methods (e.g. Euler method) to solve the governing differential equations of a dynamical system, such as an oscillator.

Crossbar array 524 interconnects oscillators 522 and applies weight to the outputs of oscillators 522. In some embodiments, crossbar array 524 is configured to fully connect oscillators 522. In such a case, each oscillator 522 can be coupled with all other oscillators 522 in stochastic computing unit 520. For example, an output line from a particular oscillator 522 is connected via crossbar array 524 (e.g. through a reconfigurable resistance) to the input line of each remaining oscillator 522. Thus, crossbar array 524 is configured in a traditional manner. Alternatively, crossbar array 524 may sparsely connects oscillators 522. In this case, an output line from a particular oscillator 522 is connected via crossbar array 524 (e.g. through the reconfigurable resistance) to only a subset of the input lines to other oscillators 522.

In addition, stochastic computing unit 520 includes demultiplexer 525. Demultiplexer 525 may select which outputs from oscillators 522 are provided to crossbar array 524. Thus, demultiplexer 525 may be viewed as a mechanism for applying a zero weight and/or for reconfiguring the oscillators 522 coupled through crossbar array 524. For example, crossbar array 524 may fully connect oscillators 522. Suppose that there are N oscillators 522. The output from oscillators 522 to demultiplexer 525 may be N parallel lines or other analogous mechanism for providing signals from all oscillators 522 to demultiplexer 525. Demultiplexer 525 may be an N:D multiplexer. Demultiplexer 525 thus removes some portion of the N outputs and provides a subset of D outputs of oscillators 522 to crossbar array 524. Thus, demultiplexer 525 prevents the output from N-D oscillators 522 from reaching crossbar array 524 (e.g. applies a weight of zero to N-D outputs prior to crossbar array 524). In this case, crossbar array 524 weights the output from remaining D oscillators 522 and provides the weighted outputs from the D remaining oscillators 522 to all N oscillators 522. Thus, oscillators 522 may be sparsely connected even if crossbar array 524 is configured to fully connect oscillators 522. Demultiplexer 525 may also be reconfigurable such that the outputs of oscillators 522 coupled to crossbar array 524 may be altered.

Stochastic computing unit 520 may be utilized in solving CO problems as well as problems in other fields. Further, stochastic computing unit 520 is reconfigurable. Thus, an OPU employing stochastic computing unit 520 may enjoy benefits described herein.

Figure 6:
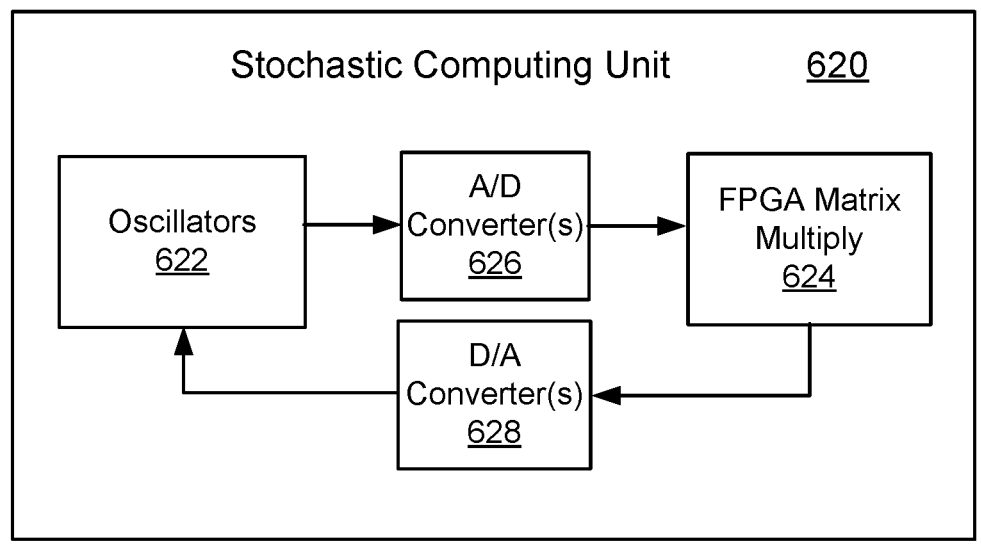
FIG. 6 depicts another embodiment of a stochastic computing unit.

FIG. 6 is a block diagram depicting an embodiment of stochastic computing unit 620 usable in an OPU, such as OPU 110 and/or 210. Stochastic computing unit 620 is analogous to stochastic computing units 120, 320, 420 and 520. Thus, stochastic computing unit 620 is configured to provide, based on data input to the stochastic computing unit 620, responses that are probabilistic in nature. Stochastic computing unit 620 includes oscillators 622 and FPGA 624. Oscillators 622 are analogous to nodes 122 and oscillators 422 AND 522. Crossbar array 624 is analogous to multiplication unit 124. In addition, stochastic computing unit 520 includes A/D converter(s) 626 and D/A converter(s) 628.

Oscillators 622 have outputs that change with time and depend upon initial conditions, as described above for nodes 122 and oscillators 422 and 522. Any number of oscillators 622 might present in stochastic computing unit 620. In some embodiments, each of the oscillators 622 include or consist of circuit components that are utilized at temperatures at or above zero degrees Celsius (e.g. room temperature or above). In some embodiments, each oscillator 622 may include or consist of circuit components formed on silicon wafers as part of an integrated circuit. In some embodiments, oscillators 622 are analog oscillators. In other embodiments, oscillators 622 may include or consist of components that are digital. The oscillators may also be digital representations of oscillators, simulating oscillator values such as the amplitude or phase. The digital oscillators may be implemented by solving differential equations which govern the dynamics of an oscillator system. For example, the nodes may use one of a variety of methods (e.g. Euler method) to solve the governing differential equations of a dynamical system, such as an oscillator.

FPGA 624 interconnects oscillators 622 and applies weight to the outputs of oscillators 622. Although one FPGA 624 is shown, in some embodiments, multiple FPGAs may be present. FPGA 624 is configured to selectably connect oscillators 622. Thus, FPGA 624 may fully connect or sparsely connect oscillators 622. Both the weights applied and connectivity may be reconfigured in FPGA 624.

In addition, stochastic computing unit 620 includes A/D converter(s) 626 and D/A converter(s) 628. Converters 626 and 628 may be utilized for analog oscillators 622. Thus, A/D converter 626 converts the analog output of oscillators 622 to a digital input for FPGA 624. D/A converter 628 converts the digital signal from FPGA 624 to an analog input for oscillators 622. If oscillators 522 are digital, converters 626 may be omitted.

Stochastic computing unit 620 may be utilized in solving CO problems as well as problems in other fields. Further, stochastic computing unit 620 may be readily reconfigured utilizing FPGA 624. Thus, an OPU employing stochastic computing unit 620 may enjoy benefits described herein.

Figure 7:
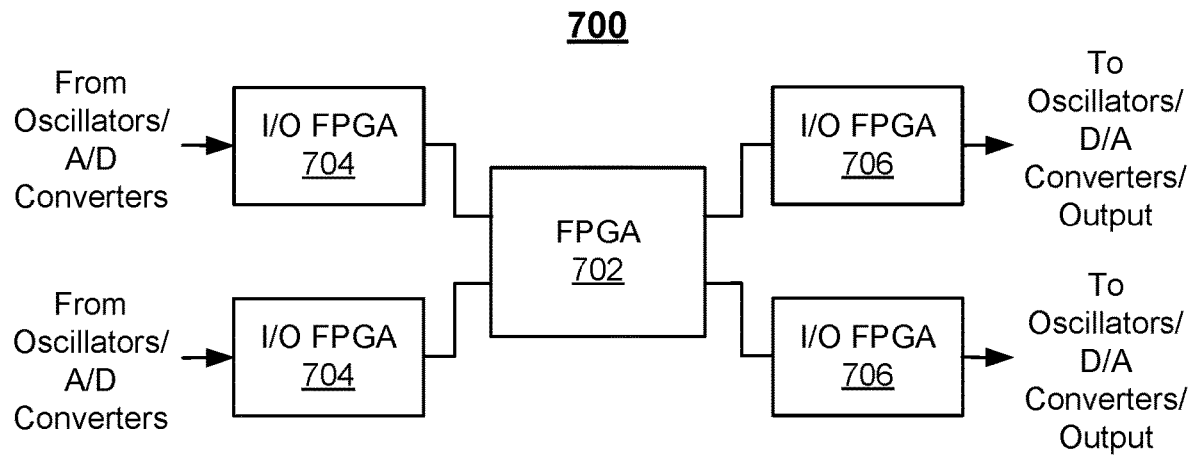
FIG. 7 is a block diagram depicting an embodiment of an architecture using multiple FPGAs.
Figure 8:
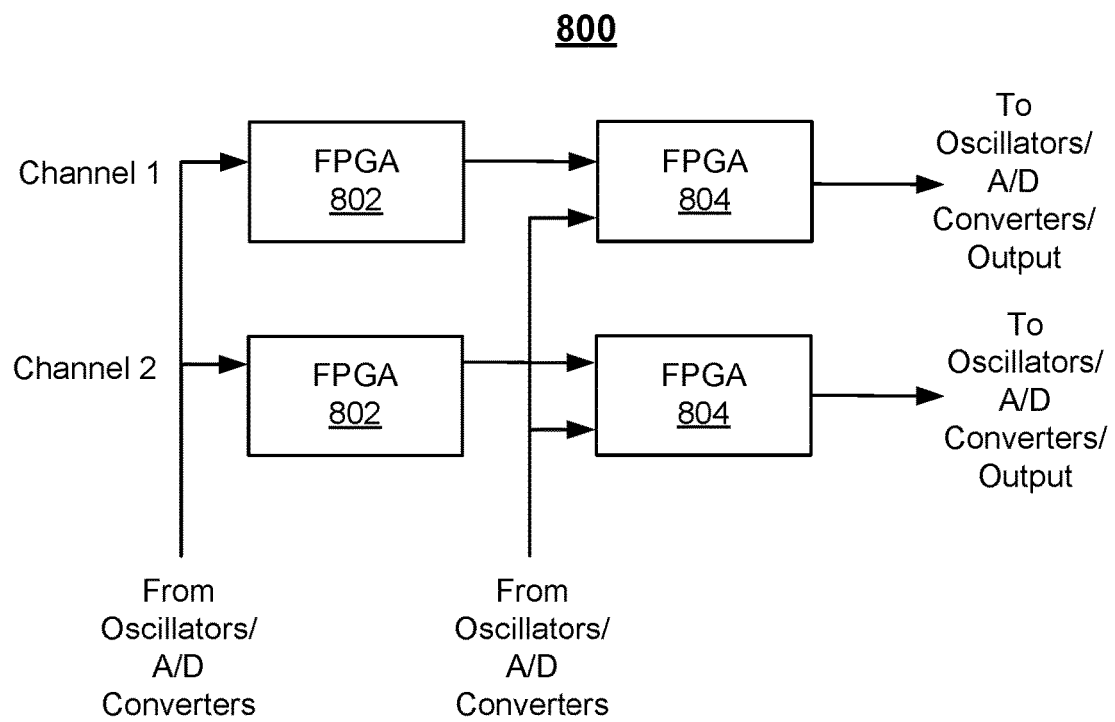
FIG. 8 is a block diagram depicting another embodiment of an architecture using multiple FPGAs.
Figure 9:
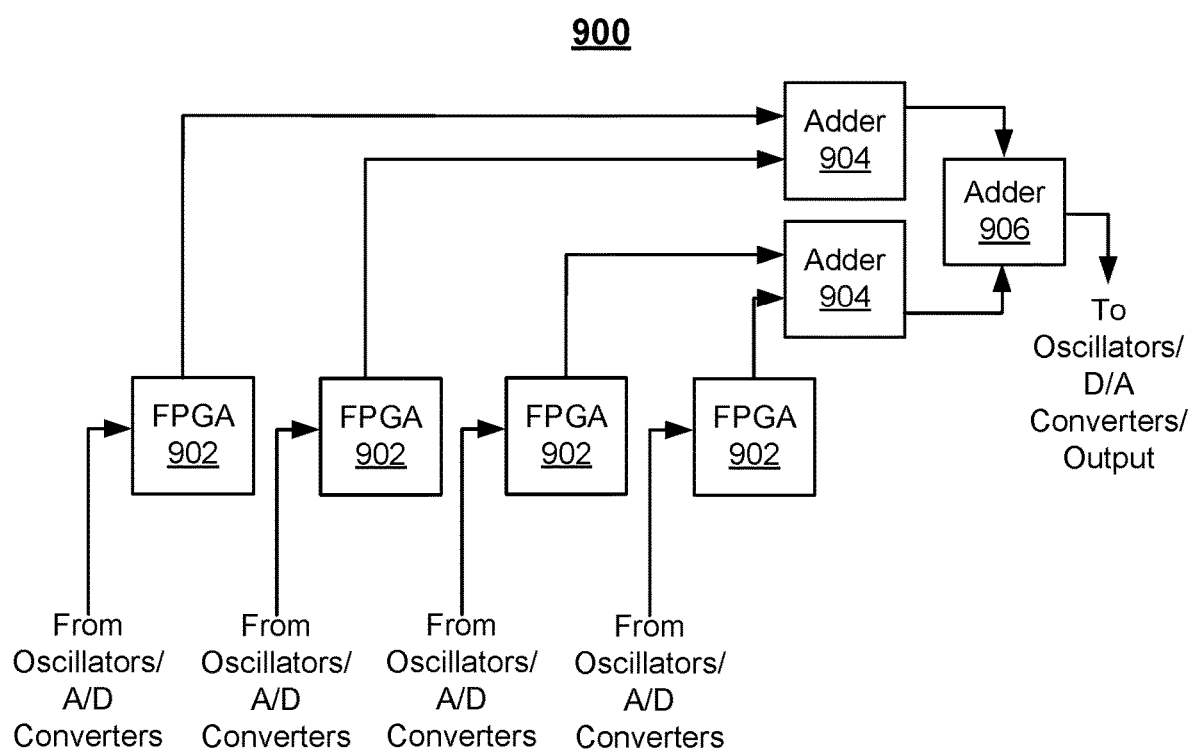
FIG. 9 is a block diagram depicting another embodiment of an architecture using multiple FPGAs.

As discussed above, multiple programmable interconnects and/or a plurality of multiplication units may be used in an OPU and stochastic computing unit, respectively. For example, multiple FPGAs may be utilized in a stochastic computing unit, such as FGPA(s) 624 in stochastic computing unit 620. Similarly, multiple FPGAs may be utilized in OPUs, such as FPGA(s) 330 in OPU 310. FIGS. 7-9 are block diagrams depicting embodiments of possible using multiple FPGAs. Although particular architectures, particular numbers of FPGAs having certain functions are shown in FIGS. 7-9, in other embodiments, other architectures, other numbers of FPGAs and/or FPGAs having additional and/or other functions may be used. The architectures depicted in FIGS. 7-9 may be used within stochastic computing units and/or between stochastic computing units. The architectures depicted in FIGS. 7-9 may have improved scaling because the number of connections to a single FPGA is typically limited.

FIG. 7 is a block diagram depicting an embodiment of architecture 700 using multiple FPGAs. Architecture 700 includes FPGA 702 utilized in applying weights to outputs of nodes or responses. Thus, FPGA 702 may be considered to perform a matrix multiplication analogous to that performed by crossbar arrays 424 and 524 or FPGAs 330 and 624. Remaining FPGAs 704 and 706 are utilized in serializing and deserializing data. More specifically, FPGAs 704 serialize output from oscillators (not shown in FIG. 7) or responses from stochastic computing units (not shown in FIG. 7). For analog oscillators or analog responses from stochastic computing units, FPGAs 704 receive data from A/D converters (not shown in FIG. 7), such as A/D converters 340. The serialized output or responses are provided as input to FPGA 702. FPGAs 706 deserialize outgoing data from FPGA 702. For example, FPGAs 706 deserialize the weighted output or weighted responses from FPGA 702. The deserialized data may be provided to oscillators or stochastic computing units. For weighted data being provided to analog oscillators or analog stochastic computing units, FPGAs 706 provide data to D/A converters (not shown in FIG. 7), such as D/A converters 350. Thus, architecture 700 allows for the use of multiple FPGAs and some scaling of the techniques described herein.

FIG. 8 is a block diagram depicting an embodiment of architecture 800 using multiple FPGAs. Architecture 800 includes multiple FPGAs 802 and 804 utilized in applying weights to outputs of nodes or responses. Thus, FPGAs 802 and 804 may each be considered to perform part of a matrix multiplication analogous to that performed by crossbar arrays 424 and 524 or FPGAs 330 and 624. More specifically, each FPGA 802 or 804 in a channel receives a portion of the oscillator outputs or stochastic computing unit responses. In some embodiments, the oscillator outputs or stochastic computing unit responses are serialized prior to be provided to FPGA 802 or 804, for example using an I/O FPGA such as FPGA 704. Thus, for each additional channel, there may be an additional latency due to the serialization. For analog oscillators or analog responses from stochastic computing units, data from A/D converters (not shown in FIG. 8), such as A/D converters 340, is received by FPGAs 802 and 804. Each FPGA 804 in a channel adds to it the output of the previous FPGAs 802 in the channel. Thus the FPGAs 802 and 804 in a channel are daisy-chained. The final FPGA 804 in a channel provides the weighted output or weighted responses to the oscillators or stochastic computing units. In some embodiments, the weighted outputs or weighted responses from FPGA 804 are deserialized, for example using an I/O FPGA such as FPGA 706. For analog oscillators or analog stochastic computing units, data from FPGAs 804 is provided to D/A converters (not shown in FIG. 8), such as D/A converters 350. Additional FPGAs and/or additional channels may be added for a larger number of nodes and/or a larger number of stochastic computing units. Thus, architecture 800 allows for the use of multiple FPGAs and some scaling of the techniques described herein.

FIG. 9 is a block diagram depicting an embodiment of architecture 900 using multiple FPGAs. Architecture 900 includes multiple FPGAs 902 utilized in applying weights to outputs of nodes or responses. Thus, FPGAs 902 may each be considered to perform part of a matrix multiplication analogous to that performed by crossbar arrays 424 and 524 or FPGAs 330 and 624. The weighted output or weighted responses from each FPGA 902 may be added. Multiple adders may be utilized for larger systems. For example, architecture 900 includes adders 904 that receive output from FPGAs 902. In some embodiments, adders 904 may be implemented using FPGAs. Architecture 900 also includes adder 906 that combines output from adders 904. More specifically, each FPGA 902 receives a portion of the oscillator outputs or stochastic computing unit responses. In some embodiments, the oscillator outputs or stochastic computing unit responses are serialized prior to be provided to FPGAs 902, for example using an I/O FPGA such as FPGA 704. For analog oscillators or analog responses from stochastic computing units, data from A/D converters (not shown in FIG. 9), such as A/D converters 340, is received at FPGAs 902. Each FPGA 902 provides its output to an adder 904. Adders 904 combine the weighted outputs or weighted responses from the corresponding FPGAs 902. Adder 906 combines the summed weighted outputs or the summed weighted responses from adders 904. Adder 906 provides the weighted output or weighted responses to the oscillators or stochastic computing units. For analog oscillators or analog stochastic computing units, adder 906 provides data to D/A converters (not shown in FIG. 9), such as D/A converters 350. In some embodiments, the weighted outputs or weighted responses from adder 906 are deserialized, for example using an I/O FPGA such as FPGA 706. Thus, architecture 900 allows for the use of multiple FPGAs and some scaling of the techniques described herein.

Figure 10:
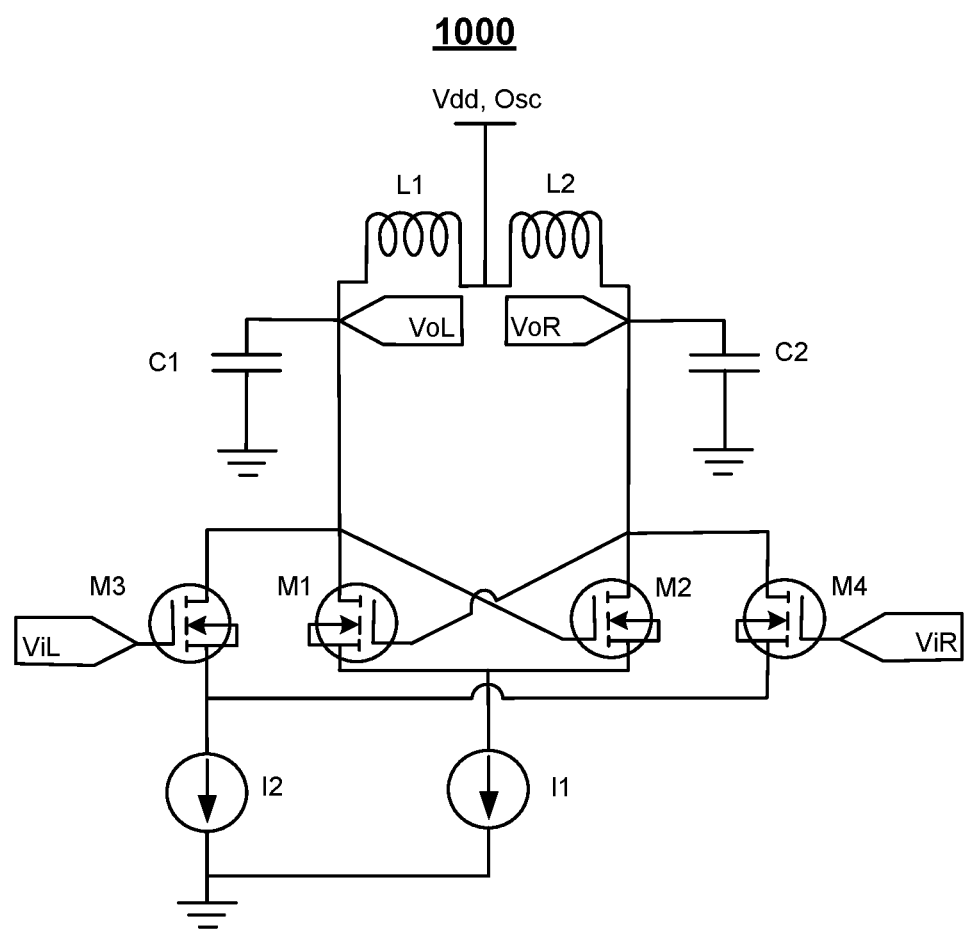
FIG. 10 depicts an embodiment of an oscillator used in a node.

FIG. 10 depicts an embodiment of oscillator 1000 usable in a stochastic computing unit. Oscillator 1000 may be usable in nodes 122 and 322 and/or as oscillators 422, 522 and 622. In the embodiment shown, oscillator 1000 consist of circuit components that are utilized at temperatures at or above zero degrees Celsius (e.g. room temperature or above). In addition, oscillator 1000 consists of circuit components formed on silicon wafers as part of an integrated circuit. In other embodiments, other analog and/or digital oscillators might be used in addition to or in lieu of oscillator 1000.

Transistors M1 and M2 form a cross-coupled pair, which provides a negative resistance component and may allow for unity loop gain. The coupling signal from the other oscillators in a stochastic computing unit in which oscillator 1000 is utilized is applied differentially at ViL and ViR, through transistors M3 and M4. Current source I2 provides the bias current for the coupling signal. The output voltage of oscillator 1000 is tapped at nodes VoL and VoR, directly out from the oscillating LC tank. The LC tank circuit includes L1, C1, and L2, C2. Current source I1 provides a biasing current for the oscillator circuit and can also be used for injection locking to help polarize the phases of oscillator 1000 to 0° and 180°.

Differential analog crossbar array(s), such as crossbar array 424 and/or 524 may be used in connection with oscillator 1000. FPGA(s), such as FPGA 624 and/or another programmable interconnect may apply the signals into input nodes ViL and ViR. In some embodiments, the analog coupling coefficients from the Hamiltonian may be mapped linearly to the ratio of the gains between various ones of oscillator 1000.

Oscillator 1000 may be utilized in nodes of stochastic computing units, such as stochastic computing units 120, 320, 420, 520 and/or 620, of an OPU such as OPU 110 and/or 120. Thus, oscillator 1000 may be utilized in CO problems as well as problems in other fields. In other embodiments other oscillators or analogous circuits may be used. Consequently, an OPU employing stochastic computing units and programmable interconnect(s) may be utilized to more readily provide solutions for CO and other problems not readily solvable utilizing conventional computing techniques.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:
1. A system, comprising:
an optimization processing unit (OPU) including
a plurality of stochastic computing units, each of the plurality of stochastic computing units including a plurality of nodes and at least one multiplication unit configured to interconnect at least a portion of the plurality of nodes, each of the plurality of nodes including an oscillator selected from an analog oscillator and a digital representation of the analog oscillator, the multiplication unit multiplying an output from a node of the at least the portion of the plurality of nodes by a weight to provide a weighted output and providing the weighted output to an input of at least one other node of the at least the portion of the plurality of nodes; and at least one programmable interconnect configured to provide weights for and to selectably couple a portion of the plurality of stochastic computing units, the at least one programmable interconnect weighting at least one response from a first stochastic computing unit of the portion of the plurality of stochastic computing units to provide at least one weighted response and providing the at least one weighted response to a second stochastic computing unit of the portion of the plurality of stochastic computing units.

2. The system of claim 1 wherein at least one the programmable interconnect includes at least one field programmable gate array (FPGA).

3. The system of claim 2 wherein the plurality of nodes are fully connected through the multiplication unit.

4. The system of claim 3 wherein the at least one multiplication unit includes a crossbar array.

5. The system of claim 2, wherein the at least one multiplication unit is programmable.

6. The system of claim 5, wherein the plurality of nodes are sparsely connected through the at least one multiplication unit.

7. The system of claim 5, wherein the at least one multiplication unit includes at least one additional FPGA.

8. The system of claim 2, wherein each of the plurality of nodes operate at not less than zero degrees Celsius.

9. The system of claim 1, wherein the digital representation of the analog oscillator is configured to solve governing differential equations for the analog oscillator and wherein the analog oscillator is an inductor-capacitor oscillator.

10. The system of claim 1, further comprising:
at least one of a central processing unit coupled with the OPU and a graphics processing unit coupled with the OPU.

11. A system, comprising:
at least one processor; and
an optimization processing unit (OPU) coupled with the at least one processor, the OPU including a plurality of stochastic computing units and at least field programmable gate array (FPGA), each of the plurality of stochastic computing units including a plurality of nodes and at least one multiplication unit configured to interconnect at least a portion of the plurality of nodes, each of the plurality of nodes corresponding to an oscillator, the at least one multiplication unit being configured to multiply an output sampled from a node of the plurality of nodes with a corresponding weight, the FPGA being configured to provide weights for and to selectably couple a portion of the plurality of stochastic computing units;

wherein the oscillator is selected from an analog oscillator and a digital representation of the analog oscillator.

12. A method, comprising:
receiving, at an optimization processing unit (OPU), data for at least a portion of an optimization problem, the OPU including a plurality of stochastic computing units and at least one programmable interconnect, each of the plurality of stochastic computing units including a plurality of nodes and at least one multiplication unit configured to interconnect at least a portion of the plurality of nodes, each of the plurality of nodes including an oscillator selected from an analog oscillator and a digital representation of the analog oscillator, the multiplication unit multiplying an output from a node of the at least the portion of the plurality of nodes by a weight to provide a weighted output and providing the weighted output to an input of at least one other node of the at least the portion of the plurality of nodes;

calculating, in the plurality of stochastic computing units, a plurality of responses for the at least the portion of the optimization problem;

applying, by the at least one programmable interconnect, a plurality of weights to the plurality of responses from the plurality of stochastic computing units to provide a plurality of weighted responses; and providing, by the at least one programmable interconnect, at least one of the plurality of weighted responses for each of the plurality of stochastic computing units as at least one input to each stochastic computing unit of a portion of the plurality of stochastic computing units.

13. The method of claim 12 wherein at least one the programmable interconnect includes at least one field programmable gate array (FPGA).

14. The method of claim 12, wherein each of the plurality of nodes operate at not less than zero degrees Celsius.

15. The method of claim 12, wherein the calculating further includes:
calculating the plurality of responses in parallel in the plurality of stochastic computing units.

16. The method of claim 12, wherein the receiving further includes:
receiving, at the OPU, the at least the portion of the data for the optimization problem from at least one of a central processing unit coupled with the OPU and a graphics processing unit coupled with the OPU.

* * * * *

UNITED STATES PATENT AND TRADEMARK OFFICE
CERTIFICATE OF CORRECTION

PATENT NO. : 11,604,913 B2
APPLICATION NO. : 16/847140
DATED : March 14, 2023
INVENTOR(S) : Jeffrey Chou and Suraj Bramhavar It is certified that error appears in the above-identified patent and that said Letters Patent is hereby corrected as shown below:

In the Claims

In Column 15, Line(s) 15, Claim 2, after "claim 1", insert --,--.
In Column 15, Line(s) 18, Claim 3, after "claim 2", insert --,--.
In Column 15, Line(s) 20, Claim 4, after "claim 3", insert --,--.
In Column 16, Line(s) 35, Claim 13, after "claim 12", insert --,--.

Signed and Sealed this
Seventeenth Day of October, 2023

Katherine Kelly Vidal
Director of the United States Patent and Trademark Office